United States Patent

Arvidsson

[11] Patent Number: 4,484,194
[45] Date of Patent: Nov. 20, 1984

[54] ARRANGEMENT IN A RADAR SYSTEM FOR CORRECTION OF PHASE AND AMPLITUDE ERRORS IN A VIDEO SIGNAL

[75] Inventor: Erik R. Arvidsson, Frölunda, Sweden

[73] Assignee: Telefonaktiebolaget L M Ericsson, Stockholm, Sweden

[21] Appl. No.: 297,836

[22] Filed: Aug. 31, 1981

[30] Foreign Application Priority Data

Sep. 12, 1980 [SE] Sweden ............................ 8006396

[51] Int. Cl.³ .............................................. G01S 7/40
[52] U.S. Cl. ................................. 343/17.7; 343/5 NQ
[58] Field of Search ................... 343/5 NQ, 7.7, 7 A, 343/17.7; 324/58.5 R; 329/50; 331/4; 455/260

[56] References Cited

U.S. PATENT DOCUMENTS

| | | | |
|---|---|---|---|
| 3,794,998 | 2/1974 | Pearson, Jr. et al. | 343/17.7 |
| 3,883,870 | 5/1975 | Kunz | 343/17.7 |
| 3,950,750 | 4/1976 | Churchill et al. | 343/17.7 |
| 4,003,054 | 1/1977 | Goldstone | 343/17.7 |
| 4,079,329 | 3/1978 | England et al. | 329/50 |
| 4,083,015 | 4/1978 | Popodi | 331/4 |
| 4,093,949 | 6/1978 | Evans | 343/5 NQ X |
| 4,122,448 | 10/1978 | Martin | 343/17.7 |
| 4,132,990 | 1/1979 | Di Domizio | 343/5 NQ X |

*Primary Examiner*—Maynard R. Wilbur
*Assistant Examiner*—K. R. Kaiser
*Attorney, Agent, or Firm*—Roberts Spiecens Cohen

[57] ABSTRACT

An arrangement is provided for correcting the phase and amplitude errors occurring in the quadrature detector of a Doppler radar system. A correction unit (KE) is connected to both analogue-digital converters (AD1, AD2) in the I and Q channels to receive a radar signal which has been received by the system antenna and phase-detected in the quadrature detector (FD1, FD2, FS). The output of the correction unit (KE) is connected to a regulating network (RN) for sensing the output signals from the correction unit (KE) and controlling the latter so that the amplitude and phase errors (a' and $\theta'$) will be zero.

6 Claims, 7 Drawing Figures

CORRECTION UNIT
KE

CORRECTION UNIT
KE

ARRANGEMENT IN A RADAR SYSTEM FOR CORRECTION OF PHASE AND AMPLITUDE ERRORS IN A VIDEO SIGNAL

TECHNICAL FIELD

The present invention relates to an arrangement incorporated in a coherent Doppler radar system for correction of the errors in amplitude and phase of the received signal, occurring in the quadrature detector of the system.

BACKGROUND ART

In a Doppler radar system, the Doppler frequency of a target is determined by illuminating the target with a transmitted signal, the echo of which is received and its signal processed in the receiver of the system. Before this signal processing in the MTI processor of the receiver, the target echo signal is taken through a quadrature detector, in which phase detection of the received signal is performed against two orthogonal components. The purpose of this operation is to form a correct envelope signal for the detection at the final determination of the Doppler frequency. The division takes place in two channels, a so-called I channel ("in phase") and a so-called Q channel ("quadrature"), the output signals from the phase detectors arranged in the respective channels being processed individually before the final absolute value formation.

The above-mentioned division into I and Q channels by means of two phase detectors has been known for a long time, and consequently the problems thus occurring are also well known. Due to imperfections in both phase detectors as well as imperfections in the unit which phase-shifts the reference signal to the phase detector 90° in the Q channel, two components which are exactly orthogonal are not obtained in the received signal. This gives a phase error in the signal obtained from the detectors. Further, the attenuation in both detectors is not exactly alike, resulting in that the component in one channel is attenuated more or less than the component in the other channel, i.e., an amplitude error is obtained in the subsequent signal of which the envelope is detected.

A number of previously known means have been proposed to remedy the above-mentioned imperfections of the quadrature detector. The earliest known method of improving accuracy was carefully to tune the detector to the best possible phase and amplitude similarity. New signal processing functions have substantially higher demands, making such tuning inadequate.

The U.S. Pat. Nos. 3,950,750, 4,003,054 and 4,122,448 illustrate systems in which special test signals are periodically connected to the quadrature detector. According to the U.S. Pat. No. 3,950,750, the output signal from the quadrature detector constituting the reply to the incoming test signal is analysed, and from the analysed output signal there is derived a plurality of correction coefficients which are supplied to the signals obtained when the radar illuminates an actual target.

DISCLOSURE OF INVENTION

In previously known systems, a test signal is introduced into the system quadrature detector, and correction signals are formed from the response of the test signal for acting on the output signals from the detector, so that the error becomes zero. In accordance with the present invention, the first step is to use an actual radar signal obtained from the antenna, this signal being applied to a correction unit after phase detection and analogue-digital conversion. The signals across the respective channels (I and Q) are applied to a correction unit connected to the analogue-digital converter in the respective channel, and the correction unit corrects these signals in the respective channels with respect to correct amplitude and phase. The correction is executed in response to correction signals from a regulating network, which senses the output signals from the correction links and controls the units in the correction links so that such errors become zero.

An object of the present invention is thus to provide an arrangement for eliminating the amplitude and phase errors occurring in a quadrature detector incorporated in the receiver of a Doppler radar system, by utilizing a correction link and a regulating network associated therewith for controlling the link such that the errors become zero.

An advantage with the arrangement is that the normal ordinary signals in the radar receiver can be utilized, a special test signal thus not being necessary.

BRIEF DESCRIPTION OF THE DRAWING

The invention will now be described more fully while referring to the appended drawings, on which

PREFERRED EMBODIMENTS

Figures 1, 2:
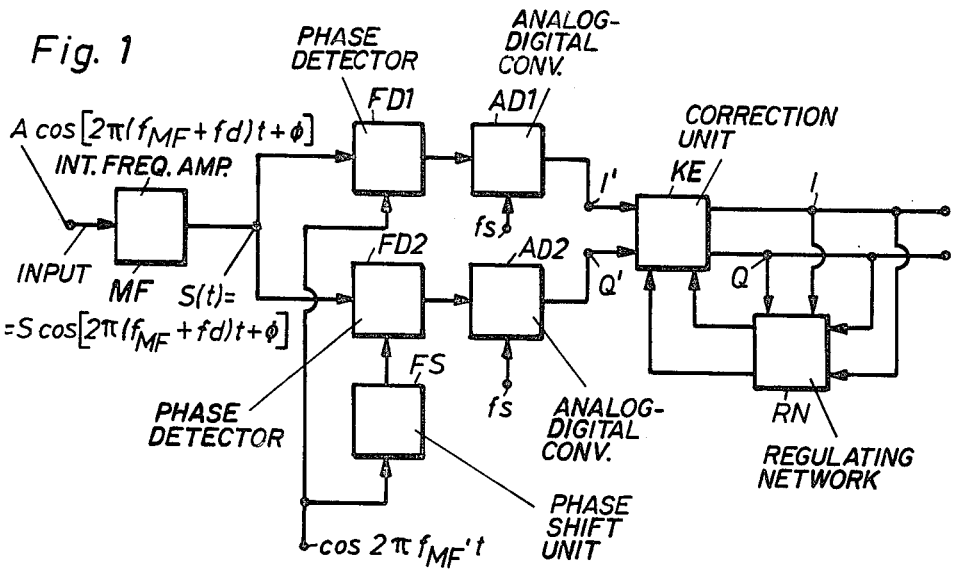
FIG. 1 is a block diagram of that portion of the radar receiver containing the quadrature detector, correction unit and a regulating network in accordance with the invention.
FIG. 2 shows a polar coordinate system for illustrating the errors occurring in the quadrature detector of FIG. 1.

FIG. 1 is a block diagram containing the units most closely associated with the arrangement in accordance with the invention. A received radar signal appears across the input of the intermediate frequency amplifier MF following after the radar system circulator and mixer (not shown), which are conventionally connected to the radar antenna. After the intermediate frequency amplifier MF there comes the quadrature detector, which, as is known, contains a first phase detector FD1 in one channel and a second phase detector in the other channel. In a Doppler radar system, the signal to both phase detectors, FD1, FD2 is, for example, a sinusoidal signal $S \cos\{2\pi(f_{MF}+f_d)t+\phi\}$, where $f_{MF}$ is a reference frequency generated in the receiver, $f_d$ is the Doppler frequency and $\phi$ an unknown (and variable) phase difference between the reference and received signals.

A phase shift unit FS is connected to the phase detector FD2, to shift the phase of the reference signal $\cos 2\pi(f_{MF}t)$ applied to the detector FD2 by 90°, while the phase detector FD1 receives the reference signal $\cos 2\pi f_{MF}t$ without phase shift. Phase detection in relation to the reference signal ($\cos f_{MF}t$) thus takes place in the detectors FD1, FD2, and a bipolar video signal with a frequency equal to the Doppler displacement $f_d$ is obtained across the outputs of I' and Q'.

The analogue-digital converters AD1, AD2 are connected to the phase detectors FD1 and FD2 in the respective channels for converting the detected analogue signals to digital signals with a suitable sampling frequency $f_s$.

Due to imperfections in the units FD1, FD2 and FS, no exact phase detection against two orthogonal signals (i.e., $\cos 2\pi f_{MF} t$ and $\cos 2\pi f_{MF} t + \pi/2$) can be achieved. The signals occurring in the channels I' and Q' are thus burdened with a certain error in amplitude and phase, which will be eliminated with the aid of the arrangement in accordance with the invention. For this purpose, a correction unit KE is connected to both channels I' and Q', and will be described in detail in conjunction with FIGS. 3 and 4. The unit KE needs given correction signals for the correction, and these signals are formed by means of a regulating circuit RN with two separate input pairs, of which each terminal is connected to the respective channel I and Q, which together constitute both outputs of the correction unit KE. The regulating network RN will be described below in conjunction with the description of FIGS. 6 and 7.

The phase and amplitude errors between the quadrature channels I' and Q' result in that a signal can be represented in a polar coordinate system I', Q' according to FIG. 2, where the quotient between the absolute values of the unit vectors is:

$$a' = \frac{|Q|}{|I|} \neq 1.$$

If $a'$ and the phase error $\theta'$ are known, a conversion calculation can be made to obtain a correct orthogonal coordinate system I, Q with $a=1$ and $\theta=0$. The following relationships apply:

$$I = I'$$

$$Q = \frac{1}{a' \cos\theta'} Q' - I' \cdot a' \sin\theta' = \frac{Q'}{a' \cos\theta'} - I' \tan\theta'$$

Figure 3:
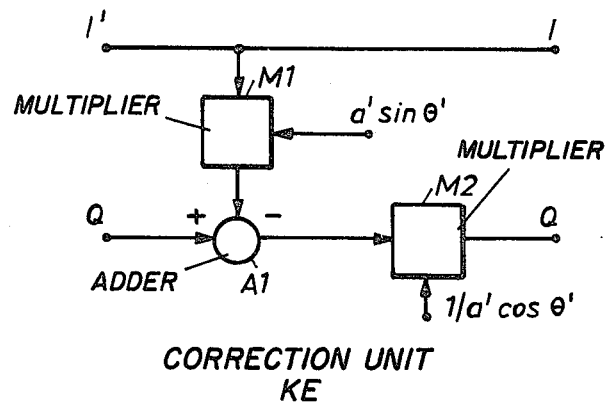
FIGS. 3 and 4 are block diagrams of two embodiments of the correction unit according in FIG. 1.
Figure 4:
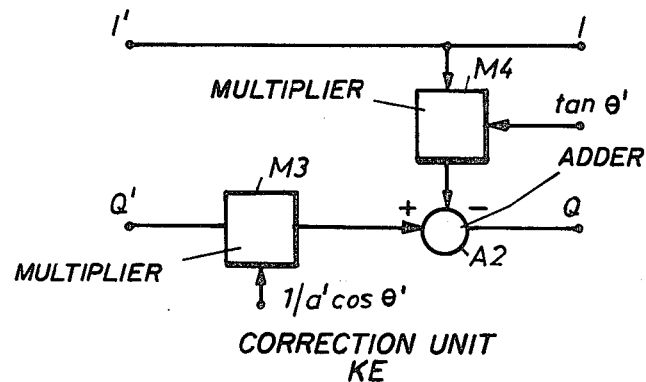

To carry this out in an apparatus, rapid digital multipliers and addition circuits are used, for example. FIGS. 3 and 4 are block diagrams of two alternative modes of realising the above relationships as far as hardware is concerned. Each of the FIGS. 3 and 4 corresponds to the correction unit KE of FIG. 1.

In FIG. 3, a multiplier M1 is connected across both channels I' and Q' via an addition circuit A1 and a multiplier M2 to the output of the addition circuit A1 in the Q' channel. In FIG. 4, a multiplier M3 is connected to the Q' channel and a multiplier M4 between both channels via one input of an addition circuit A2, the other input of which is connected to the output of the multiplier M3.

So that the correction unit KE can correct the signals coming in across the channels I' and Q', signals must be formed which correspond to the input signals $a' \sin\theta'$ and $1/a' \cos\theta'$ in the embodiment according to FIG. 3, or input signals corresponding to $1/a' \cos\theta'$ and $\tan\theta'$ in the embodiment according to FIG. 4. This is provided by the regulating network RN in FIG. 1.

There is always some form of signal across both outputs of the quadrature detector (after analogue—digital conversion). This signal can either come from thermal noise in the input stage (mixer and amplifier) of the signal receiver, or from echo signals captured by the receiver antenna. Assume that such a signal S(t) has the components $S_{I'}(t)$ and $S_{Q'}(t)$ in the respective channels I' and Q'. The phase error $\theta'$ is then obtained from the relationship:

$$\lim_{N \to \infty} \frac{1}{N} \sum_{n=0}^{N} (S_{I'})_n \cdot (S_{Q'})_n = a'/8 \cdot \bar{S}^2 \cdot \sin\theta' \quad (1)$$

This relationship can be derived in the following manner:

The output signal from the intermediate frequency amplifier MF is S(t) and is equal to:

$$= S \cos\{2\pi(f_{MF} + f_d)t + \phi)\} = S \cos\{(2\pi f_{MF} t + \phi) + 2\pi f_d t =$$

$$S\{\cos(2\pi f_{MF} t + \phi)\cos 2\pi f_d t - \sin(2\pi f_{MF} t + \phi) \cdot \sin 2\pi f_d t\}$$

The output signal from the phase detector FD1, i.e., the component in the I' direction is $S_{I'}(t)_{MF}$ and is equal to:

$$= S(t)\cos 2\pi f_{MF} t = S\{\tfrac{1}{2} \cos 2\pi f_d t \cdot \cos 4\pi f_{MF} t -$$

$$\sin 2\pi f_d t \cdot \sin(4\pi f_{MF} t + \phi) + S_{I'}(t)_{LF}\}$$

where $$S_{I'}(t)_{LF} = \frac{S}{2} \{\cos 2\pi f_d t \cos\phi - \sin 2\pi f_d t \cdot \sin\phi\} \quad (a)$$

The output signal from the phase detector FD2, i.e., the component in the Q' direction is $S_{Q'}(t)_{MF}$ and is equal to:

$$S(t) a' \cos(2\pi f_{MF} t + \pi/2 + \theta')$$

where $a'$ and $\theta'$ are the amplitude and phase errors occurring in the detector FD2. Analogically with the above it can be shown that:

$$S_{Q'}(t)_{MF} = -S \cdot a'\{\cos 2\pi f_d t \cdot \tfrac{1}{2} \{\sin(4f_{MF} + \phi + \theta')\} -$$

$$\cos(4\pi f_{MF} t + \phi - \theta') - S_{Q'}(t)_{LF}\}$$

where $$S_{Q'}(t)_{LF} = \frac{Sa'}{2} \{\sin 2\pi f_d t \cdot \cos(\theta' - \phi) - \cos 2\pi f_d t \cdot \sin(\theta' - \phi)\} \quad (b)$$

Of interest is the product $S_{I'}(t)_{LF} \cdot S_{Q'}(t)_{LF}$, which is equal to:

$$= \frac{S^2 \cdot a'}{4} \{\tfrac{1}{2} \sin 2\pi f_t d \cdot \cos 2\pi f_t d \{\cos\theta' + \cos(2\phi - \theta') + \quad (c)$$

$$\cos(\theta' - 2\phi) - \cos\theta'\} - \tfrac{1}{2} \sin^2 2\pi f_t d\{\sin\theta' + \sin(2\phi - \theta')\} -$$

$$\tfrac{1}{2} \cos^2 2\pi f_t d\{\sin\theta' + \sin(\theta' - 2\phi)$$

This relationship is valid for an individual signal sample after the analogue-digital converters AD1, AD2. The product $S_{I'} \cdot S_{Q'}$ is summed for a long period, i.e., for a large number of independent sample values. The Doppler frequency fd and the distance—dependent phase angle $\phi$ are correlated for different samples coming from the same target, but vary randomly between different targets.

If the summation time is made very much larger than the illumination time of an individual target, the result will not be affected by this correlation. For a summation over a large number of samples, the contributions from the first and last term in (c) will be zero. The same thing applies to the terms sin $(\theta'-2)$ and sin $(2\phi-\theta')$. The sum of the product $S_{I'} \cdot S_{Q'}$ for N signal samples will then be:

$$\frac{1}{N} \sum_{n=0}^{N} (S_{I'})_n \cdot (S_{Q'})_n = \frac{1}{N} \Sigma \frac{S_n^2 a'}{8} \{\sin\theta'(\sin^2 2\pi f dt +$$

$$\cos^2 2\pi f dt)\} = \frac{a'}{8} \cdot \frac{1}{N} \sum_{n=0}^{N} S_n^2 \cdot \sin\theta' = \frac{a'}{8} \cdot \bar{S}^2 \sin\theta'$$

where $\bar{S}^2$ is the mean value of the square of the amplitudes of the signal samples. This factor is always positive, but varies in magnitude depending on the signal environment of the radar.

The value of the phase error $\theta'$ can thus be determined by multiplication of both signals in the I' and Q' channels and subsequent summation. In a practical application, the summation time should be selected such that it is much longer than the illumination time of an individual spot target.

Figure 5:
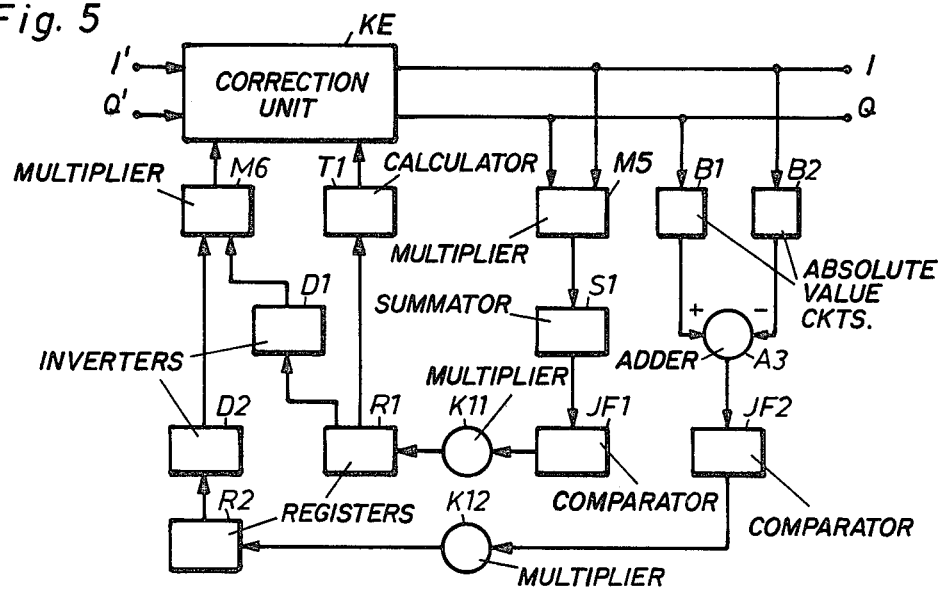
FIG. 5 is a block diagram of an embodiment of the regulating network in FIG. 1.

FIG. 5 illustrates an embodiment of the regulating network RN according to FIG. 1 for determining the phase and amplitude errors $\theta'$ and $a'$. The network according to FIG. 5 is constituted in principle of two loops. Both loops are connected to the output of the correction unit KE for sensing the output signals $S_I$ and $S_Q$ across each channel.

One loop contains a multiplier M5 and a summator S1, e.g., a feedback accumulator register for multiplying and summing both signals $S_I$, and $S_Q$ according to the relationship above. A comparator circuit JF1 is connected to the output of the summator S1, and this comparator circuit compares the output signal from the summator S1 with a zero value. If the output signal is >0 the comparator gives a binary value 1 across its output, and if the output signal is <0, a binary value −1 is given across the output. The unit K11 connected to the output of the comparator JF1 is a multiplier which multiplies the value from the comparator by a suitable scale factor. The result is stored in a register R1 connected to the output of the unit K11, and corresponds to the value of sin $\theta'$. A calculating unit T1 is connected to the register R1 for calculating the value tan $\theta'$ from the value of $\theta'$ obtained from the register R1. The unit T1 can be an adressable ROM memory in which the tangent values for a plurality of sin $\theta'$ values are recorded in table form. The output signal from the unit T1, which thus corresponds to tan $\theta'$, is then supplied to the multiplier M4 in the block diagram according to FIG. 4.

The units M5, S1, JF1, K11, R1 and T1 described above are thus connected to the correction unit so that a regulating loop is formed for controlling the value of sin $\theta$ towards zero.

Providing that the input signal to the quadrature detector has a rectangular phase distribution and that no correlation between phase and amplitude is present, the factor a' can be calculated from the relationship:

$$a' = \frac{|Q|}{|I'|} = \frac{\bar{S}_{Q'}}{\bar{S}_{I'}} \quad (2)$$

Further, a factor $$a = 1 + \Delta a = 1 + \frac{|S_Q - S_I|}{|S_I|} \text{ is introduced} \quad (3)$$

According to FIG. 5, a regulating loop is also arranged for the amplitude error to control the error $\Delta a$ towards zero, i.e., a=1. This regulating loop contains two absolute value-forming circuits B1 and B2, connected to both channels I and Q for sensing the signals $S_I$ and $S_Q$. The outputs of the circuits B1 and B2 are connected to a plus and a minus input of an adding circuit A3, the output of which is connected to a comparator circuit JF2. The latter compares the difference $|S_Q| - |S_I|$ with the value zero, and if the difference is greater than zero, +1 is obtained across the output, otherwise −1. The value across the output of the comparator JF2 is fed via a multiplier K12 to a register R2, the content of which represents the value of the quantity a'. An inverting circuit D2 is connected to the output of the register R2 to form a value 1/a', which is supplied to one input of a multiplier M6. The second input of the multiplier M6 is connected via an inverting circuit D1 to a second input of the register R1 in the regulating loop for the phase error $\theta'$. Signals representing the values 1/a' and a/cos $\theta'$ thus appear across both inputs of the multiplier M6, and across the output thereof is obtained a signal representing the value 1/a' cos $\theta'$. This value is applied to the multiplier M2 in FIG. 3, or the multiplier M3 in FIG. 4.

To prevent the signal amplitude due to the factor $a' \cdot \bar{S}^2$ i (1) above affecting the regulating network feedback amplification, the output signal of the summator S1 is limited so that only its polarity is sensed by the subsequent comparator circuit JF1. In a corresponding manner the comparator circuit JF2 only senses the alteration in polarity of the error $\Delta a$, cf relationship (3) above.

Certain simplifications of the apparatus can be made by putting tan $\theta' = \theta'$ and cos $\theta' = 1$. The error thus introduced will automatically be compensated by the regulating network RN. The register R2 in FIG. 5 can furthermore be replaced by a register (the b register) which stores a value b=1/a', in which case the polarity of the input signal to the register must be changed.

It is furthermore obvious that if the register R1 (the $\theta'$ register), can be updated at an equally high rate as the input signal rate to the multiplier M5 in FIG. 5, the summator S1 can be eliminated and the integration sequence is carried out in the register R1 on the signal obtained from the I and Q channels and processed in the multiplier M5 and comparator circuit JF1. The block diagram of FIG. 5 can thus be simplified to the block diagram of FIG. 6, the latter illustrating the preferred embodiment. Two entirely separate regulating loops are arranged in FIG. 6 for the phase and amplitud errors $\theta'$ and a'. In the regulating loop for the phase error, a comparison of the product value $S_{I'} S_{Q'}$ obtained in the multiplier M7 is made in respect of the polarity of this product, and the summation is carried out in the register R4 after multiplying by a suitable scale factor in the multiplier K21. The unit T1 in FIG. 5 has been dispensed with, since tan $\theta'$ has been approximated to $\theta'$. In the regulating loop for the amplitude error, the register R2 has been replaced by a register R3 for storing 1/a', and the multiplier M6 has been dispensed with, since cos $\theta'$ has been approximated to 1.

Figure 6:
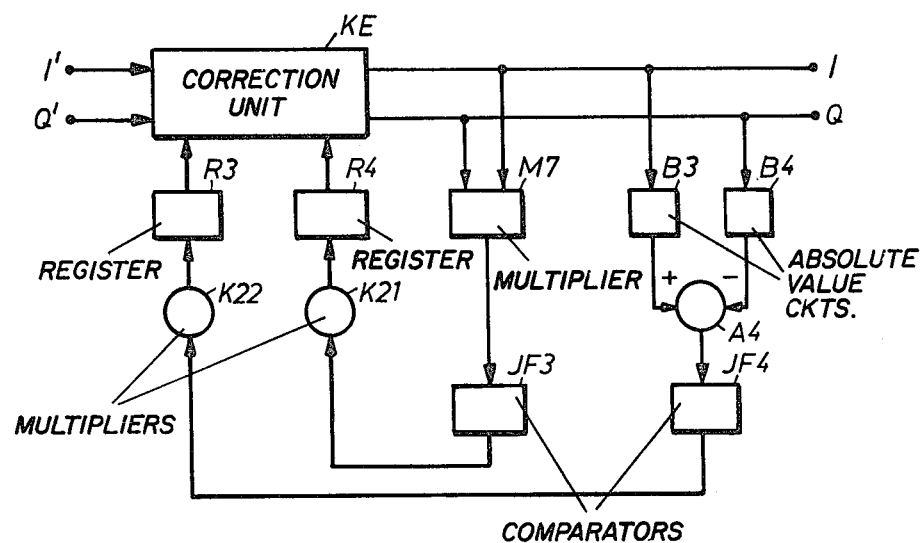
FIG. 6 illustrates a simplified embodiment of the resulting network in FIG. 5.

The regulating network according to FIGS. 5 and 6 gives correction signals to the correction unit KE in FIG. 4, but can be simply modified so that correction signals suited to the unit in FIG. 3 are delivered. In the block diagram according to FIG. 6, an inverter is connected to the output of the 1/a' register R3, followed by a multiplier with one input connected to the inverter and its other input connected to the output of the $\theta$-register R4. Across the multiplier output a signal is obtained corresponding to the value $\theta' \cdot a'$ to the multiplier M1 according to FIG. 3.

Figure 7:
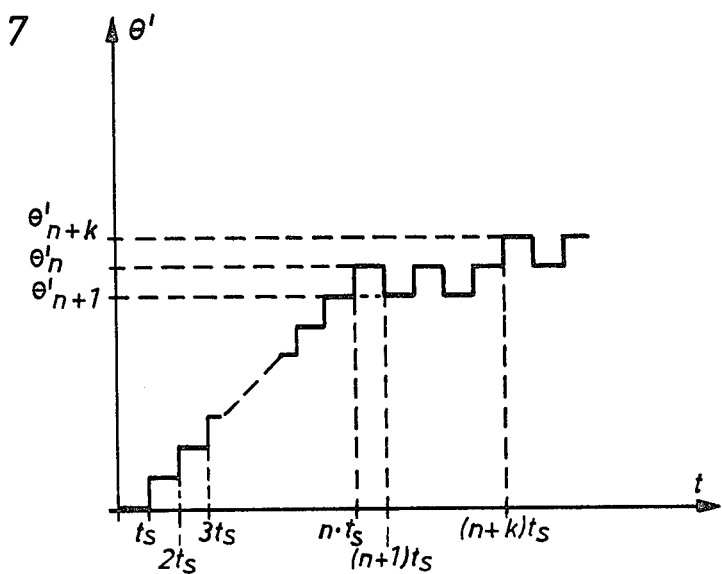
FIG. 7 is a time diagram for more closely illustrating the function of the regulating network according to FIG. 6.

FIG. 7 is a time diagram illustrating the contents of the register R4 in FIG. 6, i.e., the $\theta'$ register after a given number of sensed sampling intervals of the signals $S_I$ and $S_Q$ on the I and Q channels. After n sensed signal samples, i.e., at the time $n \cdot t_s$ where $t_s = 1/f_s$ (the sampling interval) the value of $\theta' = \theta'_n$ is such that the correction unit KE has corrected the signals $S_{I'}$ and $S_{Q'}$, such that these are as close as possible orthogonal with regard to the quantizing, and the comparator circuit JF3 delivers +1. Upon the next sensing, at $t=(n+1)t_s$, $\theta' = \theta'_{n+1}$, and the comparator JF3 delivers −1. The values $\theta'_n$ and $\theta'_{n+1}$ represent the constant error substantially to be found in the quadrature detector FD1, FD2, FS at the time $n \cdot t_s$. At the instant $(n+k)t_s$ a change occurs in the quadrature detector, e.g., due to temperature variations, and the regulating loop for the phase error $\theta'$ reacts by increasing the value of $\theta'$ to a new value $\theta'_{n+k}$, regulation according to the preceding then being carried out.

The regulating process for the phase and amplitude errors can require a somewhat longer time for coming to a steady state than if the test signal in accordance with known technology is used. This is no problem, however, since the only dynamic changes in the regulating circuit depend on temperature drift in the phase detectors and video amplifier, these changes having a long time constant.

I claim:

1. In the receiver of a coherent radar system, apparatus for generating from an input signal two signals in quadrature which are phase and amplitude corrected comprising: first and second channels, said channels including quadrature detector means receiving the input signal and analog-digital converting means, having outputs, for converting the output of the quadrature detector means to digital values; a correction means having first and second digital value inputs connected to the outputs of said analog digital converting means for receiving the quadrature digital values from said channels, first and second outputs for emitting phase and amplitude corrected quadrature digital values, and first and second modification inputs associated with the two quadrature digital values; and a regulating means having first and second loops, said first loop including first multiplier means connected to the first and second outputs of said correction means for forming products of the emitted quadrature digital values, a first comparator means for emitting first binary values in accordance with the polarity of the products from said first multiplier means, and a first register means for storing said first binary values in order to form a first modification signal related to phase error, said first modification signal being fed to one of said modification inputs in response to the signal generated by said first comparator means, and said second loop including first difference forming means connected to the first and second outputs of said correction means for forming difference values of the emitted quadrature digital values, a second comparator means for emitting second binary values in accordance with the polarity of the difference values and second register means for storing said secondary binary values to form a second modification signal related to amplitude error, said second modification signal being fed to the other of said modification inputs, and said correction unit carrying out a correction of said quadrature digital value in one channel in dependence on said first and second modification signals whereby said quadrature digital values in said channels become orthogonal.

2. The apparatus of claim 1 wherein said correction means comprises second multiplier means connected to one of said digital value inputs and said one modification input for forming first product values, second difference forming means connected to said second multiplier means and the other of said digital value inputs for forming difference values, and third multiplier means connected to said second difference forming means and said other modification input for forming second product values, the output of said third multiplier means being connected to one of the outputs of said correction means.

3. The apparatus of claim 1 wherein said correction means comprises second multiplier means connected to one of said digital value inputs and said one modification input for forming first product values, third multiplier means connected to the other digital value input and said other modification input for forming second product values, and second difference forming means receiving said first and second product values for forming difference values, the output of said second difference forming means being connected to one of the outputs of said correction means.

4. The apparatus of claim 1 further comprising a summator means, the products formed by said first multiplier means for accumulating and said first comparator means compares the value of the accumulated products with a given constant value, the results of such comparison controlling the value of the first modification signal formed by said first register means.

5. The apparatus of claim 2 further comprising a summator means for accumulating the products formed by said first multiplier means, and said first comparator means compares the value of the accumulated products with a given constant value, the results of such comparison controlling the value of the first modification signal formed by said first register means.

6. The apparatus of claim 3 further comprising a summator means for accumulating the products formed by said first multiplier means, and said first comparator means compares the value of the accumulated products with a given constant value, the results of such comparison controlling the value of the first modification signal formed by said first register means.

* * * * *